(12) United States Patent
Feldman-Peabody et al.

(10) Patent No.: US 8,039,290 B2
(45) Date of Patent: Oct. 18, 2011

(54) METHOD OF MAKING PHOTOVOLTAIC CELL

(75) Inventors: Scott Feldman-Peabody, Golden, CO (US); Bogdan Lita, Boulder, CO (US); Michael Burnash Cozens, Wheat Ridge, CO (US); Mehran Sadeghi, Kent (GB); Yu Zhao, Niskayuna, NY (US); Renee Mary Whitney, Voorheesville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/639,099

(22) Filed: Dec. 16, 2009

(65) Prior Publication Data

US 2011/0143493 A1 Jun. 16, 2011

(51) Int. Cl.
 *H01L 21/00* (2006.01)
(52) U.S. Cl. ....... 438/84; 438/94; 438/95; 257/E31.015; 257/E31.005; 257/E31.008
(58) Field of Classification Search .................. None
 See application file for complete search history.

(56) References Cited

U.S. PATENT DOCUMENTS

| | | | |
|---|---|---|---|
| 5,393,675 A | 2/1995 | Compaan | |
| 5,420,043 A | 5/1995 | Niwa | |
| 5,604,133 A | 2/1997 | Aoike | |
| 5,916,375 A | 6/1999 | Agui et al. | |
| 6,908,782 B2 | 6/2005 | Yan et al. | |
| 2004/0155255 A1 | 8/2004 | Yamamoto et al. | |
| 2009/0308454 A1* | 12/2009 | Korevaar et al. | 136/261 |
| 2010/0055827 A1* | 3/2010 | Barth et al. | 438/94 |
| 2010/0126580 A1* | 5/2010 | Farrell et al. | 136/256 |

FOREIGN PATENT DOCUMENTS

JP 2073644 A 3/1990

OTHER PUBLICATIONS

Ma et al, Copper-doped CdTe films with improved hole mobility, 2007, Applied Physics Letters, vol. 91.*
Murase et al, Electrodeposition of CdTe from Basic Aqueous Solutions Containing Ethylenediamine, 2001, Journal of the Electrochemical Society, vol. 148, C203-C210.*

* cited by examiner

*Primary Examiner* — Ha Tran T Nguyen
*Assistant Examiner* — Valerie N Brown
(74) *Attorney, Agent, or Firm* — Paul J. DiConza

(57) ABSTRACT

Methods of making a photovoltaic (PV) cell are disclosed. The methods comprise at least the steps of, providing a first component comprising a cadmium telluride (CdTe) layer comprising an interfacial region, and subjecting the first component to a functionalizing treatment in the presence of a material comprising copper.

42 Claims, 5 Drawing Sheets

METHOD OF MAKING PHOTOVOLTAIC CELL

BACKGROUND

The invention relates generally to the area of photovoltaic (PV) cells. More specifically, the invention relates to methods of making PV cells having a photo-active layer that includes cadmium telluride (CdTe). The invention also relates to methods of p-type doping of CdTe.

The solar spectrum "sunlight" contains a distribution of intensity as a function of frequency. It can be shown that the conversion efficiency for utilizing sunlight to obtain electricity via semiconductors is optimized for semiconducting band-gaps in the range vicinity between about 1.4 to about 1.5 electron volt (eV). The semiconducting band-gap of CdTe, is a good match for this requirement.

p-type CdTe is currently one of the common commercially used materials used in PV cells wherein the photo-active material is CdTe. Quite generally, in the interest of brevity of the discussions herein, PV cells including p-type CdTe as the photo-active material may be referred to as "CdTe PV cells." Similarly, PV installations including CdTe PV cells would be referred to as "CdTe PV installations." Commercial feasibility of large-scale PV installations including p-type CdTe PV cells has been demonstrated, and the cost of electricity obtained from such large-scale p-type CdTe PV installations is approaching grid parity. Commercial feasibility of smaller scale, that is, area confined, installations remains a challenge within the art due to the relatively poor overall efficiency of such smaller scale installations. Despite significant academic and industrial research and development effort, the best reported conversion efficiency "$e_B$" of p-type CdTe PV cells has been stagnant at about 16.5% for close to a decade. This best reported conversion efficiency may be compared to the entitlement-efficiency of CdTe PV cells for the solar energy spectrum, which entitlement-efficiency is about 23%. The conversion efficiency numbers may further be compared to the "module" efficiency of typical currently available commercial large-scale p-type CdTe PV installations, which module efficiency is lower, and is about 11%.

Evidently, any improvement in p-type CdTe PV cell efficiency will result in an improvement in overall efficiency of corresponding CdTe PV installations. Such improvement will enhance the competitiveness of the CdTe PV installations compared to traditional methods of generating electricity, such as from natural gas or coal. It is evident that improvement in overall efficiency will enable p-type CdTe PV cell technology to successfully penetrate markets where small-scale area confined installations are required, such as markets for domestic PV installations.

Currently known methods for manufacturing p-type CdTe PV cells on commercially viable soda-lime glass substrates necessarily require relatively low temperature processes (performed typically at temperatures ∼<600 degrees Celsius (° C.)). Such necessity for low temperature processes, is one of the reasons why it has not been possible to enhance p-type doping levels beyond a doping level "$c_M$," wherein $c_M$ ∼$5 \times 10^{14}$ per cubic centimeter (/cm$^3$). The inability to achieve p-type doping levels within CdTe, that are substantially in excess of $c_M$, is among the factors resulting in the current stagnation of the conversion efficiencies at about $e_B$.

There is a need within the art for methods of fabrication via which improved p-type CdTe PV cells having conversion efficiencies in excess of $e_M$ can be obtained. For any such methods to be commercially feasibly, they should be compatible with existing p-type CdTe PV cell fabrication process requirements such as for instance, the necessary requirement that the fabrication be performed at the relatively low temperatures mentioned above.

Methods whereby enhanced p-type doping levels within the photo-active CdTe material can be obtained, which methods are yet compatible with extant p-type CdTe PV cell fabrication processes, would therefore be highly desirable.

BRIEF DESCRIPTION

A method of making a photovoltaic (PV) cell, said method comprising the steps of, (a) providing a first component comprising a cadmium telluride (CdTe) layer comprising an interfacial region, (b) subjecting the first component to a functionalizing treatment to obtain a first green component, said functionalizing treatment comprising treating at least a portion of the interfacial region with a first material comprising copper and a second material comprising chlorine, (c) subjecting the first green component to a first annealing treatment to obtain a second green component, (d) subjecting the second green component to a processing treatment, and (e) disposing a second component adjacent the CdTe layer to form the PV cell.

A method for making a photovoltaic cell, said method comprising the steps of, (a) providing a first component comprising a cadmium telluride (CdTe) layer comprising an interfacial region; (b) subjecting the first component to a functionalizing treatment to obtain a first green component, said functionalizing treatment comprising soaking at least a portion of the interfacial region in the presence of a first solution comprising copper, (c) subjecting the first green component to a first annealing treatment in the presence of a second solution comprising chlorine to obtain a second green component, (d) subjecting the second green component to a processing treatment, and (e) disposing a second component adjacent the CdTe layer to form the photovoltaic cell.

These and other advantages and features will be more readily understood from the following detailed description of preferred embodiments of the invention that is provided in connection with the accompanying drawings.

DRAWINGS

DETAILED DESCRIPTION

Figure 1:
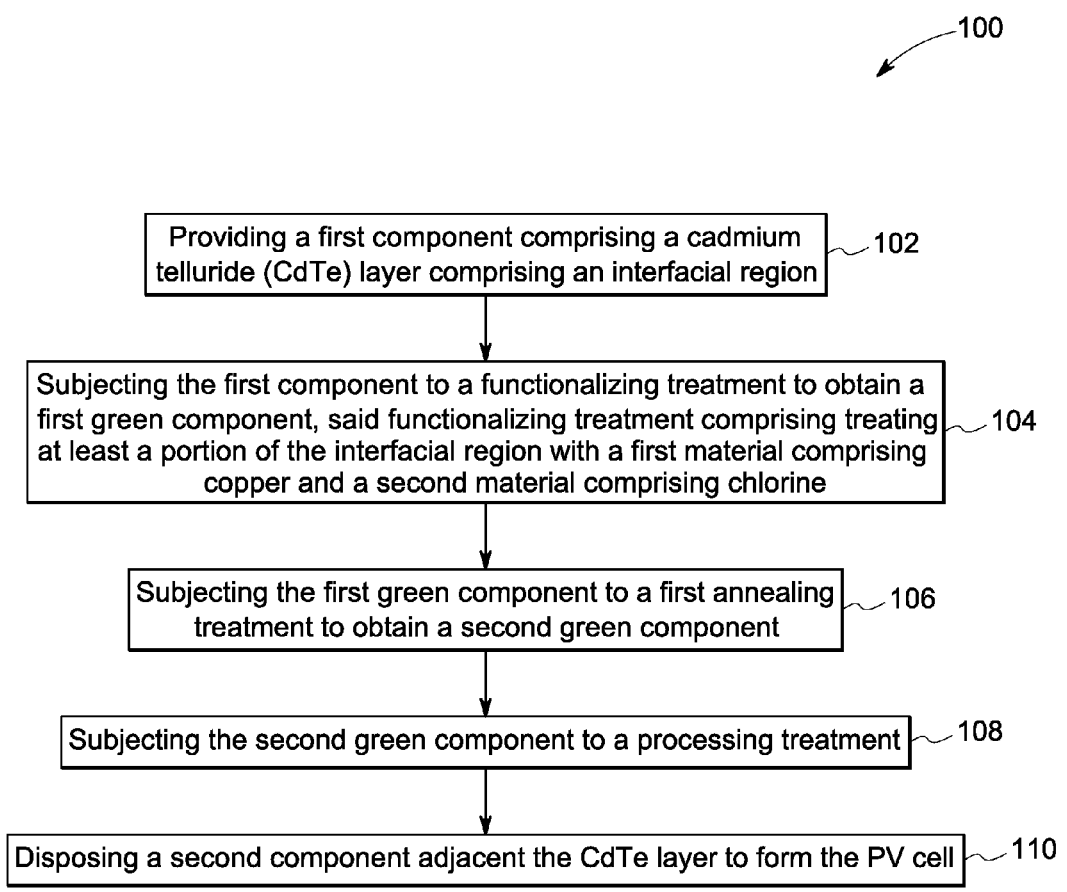
FIG. 1 is a flow-chart illustration of a method of making a PV cell, according to one embodiment of the invention.

In the following description, whenever a particular aspect or feature of an embodiment of the invention is said to comprise or consist of at least one element of a group and combinations thereof, it is understood that the aspect or feature may comprise or consist of any of the elements of the group, either individually or in combination with any of the other elements of that group.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components unless otherwise stated. As used herein, the terms "disposed on" or "deposited over" or "disposed between" refers to both secured or disposed directly in contact with and indirectly by having intervening layers therebetween.

As used herein, the term "adjacent," when used in context of discussion of different regions and/or parts of, for instance, a PV cell, may refer to the situation where the regions and/or parts under discussion are immediately next to each other, or it may also refer to a situation wherein intervening regions and/or parts are present between the regions and/or parts under discussion.

As used herein, the term "green," when used in the context of a discussion of a physical entity, such as a component, conveys that the entity is as yet in an intermediate stage of its manufacture, that is, one or more of the steps of the method employed to make or obtain the component, from the entity, have as yet not been initiated or completed. For example, a "green component" refers to a physical entity on which one or more steps of the method of making the component, wherein the obtained component displays desired or improved levels of certain physical properties, such as, energy conversion efficiency, have as yet not been performed.

As used herein, the term "interfacial region" when used in context of discussion of a physical entity refers to the region at, and in the vicinity of, any interface that the physical entity has with the surrounding environment. It is to be understood that the interfacial region is "exposed," in that, any entities present within the environment, such as chemical agents present within the environment, have direct physical access to the interfacial region.

As used herein, the term "functionalizing treatment" when used in the context of discussion of a physical entity such as a component or a green component, refers to a treatment, including a chemical treatment and/or a physical treatment of the physical entity, which treatment results in a substantial change in one or more physical properties, such as dopant concentration, or energy conversion efficiency, of the physical entity. The functionalizing treatment, may for instance, be performed as part of a step of a method of making the component.

As discussed in detail below, embodiments of the invention are directed to improved methods of making a photovoltaic (PV) cell wherein the photoactive layer includes p-type cadmium telluride (CdTe). The photoactive layer is the part of the PV cell where the electromagnetic energy of incident light occurs, for instance sunlight, is converted to electrical energy (that is, to electrical current). Quite generally, in the discussions herein it will be understood that, the term "p-type CdTe PV cell," or simply "CdTe PV cell" or "PV cell," will refer to a PV cell wherein the photoactive layer includes p-type CdTe. Embodiments of the invention disclosed herein provide also for improved methods of p-type doping of CdTe.

An issue of significance in the context of current generation p-type CdTe PV cells, is that, despite several years of research and development work by the industry and academia, it has not been possible to enhance p-type doping levels within the CdTe layer beyond about $c_M \sim 5 \times 10^{14}/cm^3$. This is among the reasons that have limited the best-reported efficiencies for p-type CdTe PV cells to about $e_B \sim 16.5\%$.

The relatively low temperature processing conditions (typically ~<500 degrees Celsius (° C.)) needed for the fabrication of p-type CdTe PV cells is among the reasons why it has not been possible to enhance p-type doping levels within CdTe. This in turn has hampered the development of p-type CdTe PV cells with efficiencies approaching the entitlement-efficiency (~23%) of CdTe PV cells for the solar energy spectrum. Quite generally, embodiments of the invention proposed herein also include methods of p-type doping CdTe, whereby p-type doping levels are enhanced.

Figure 5:
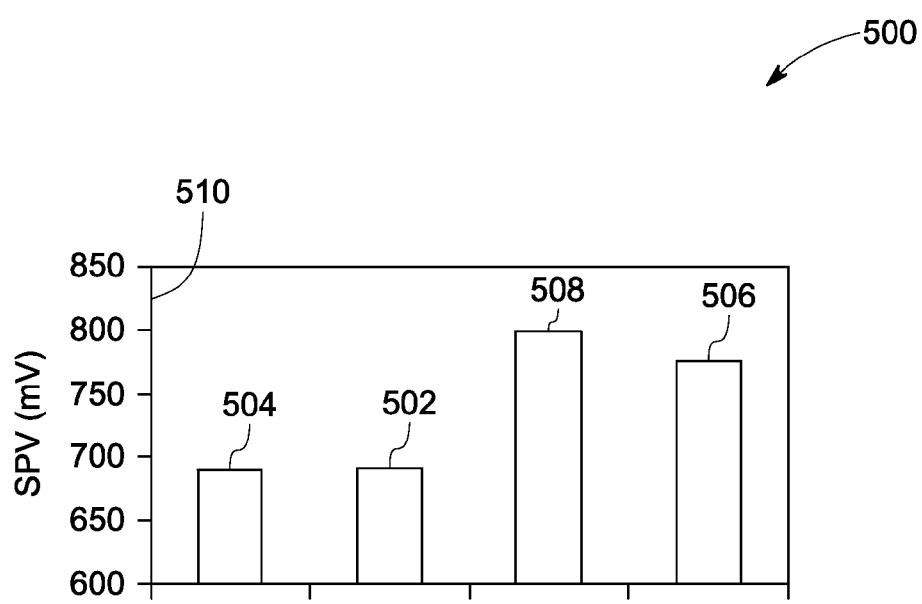
FIG. 5 is a bar-chart of surface photo-voltage values obtained on a series of second components, according to one aspect of the invention.
Figure 6:
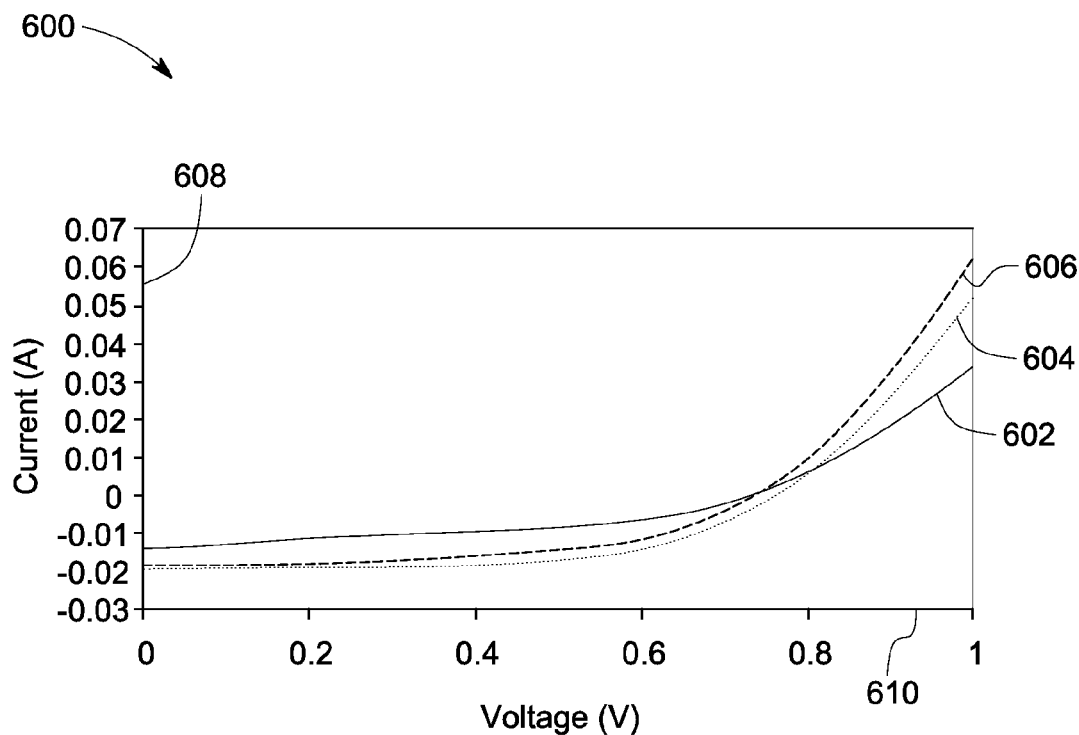
FIG. 6 shows operational characteristics data of PV cells, according to one aspect of the invention.
Figure 7:
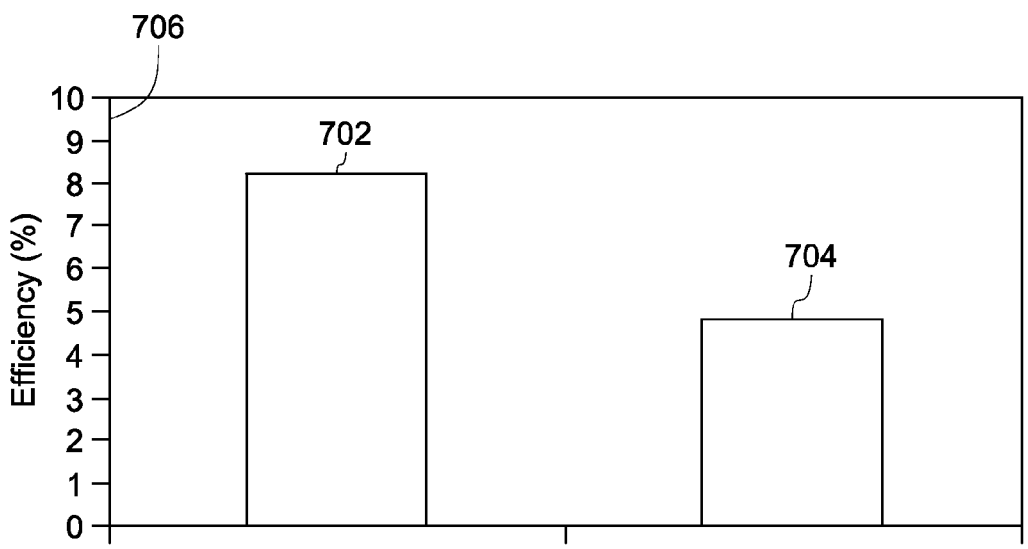
FIG. 7 is a bar-chart that compares the efficiency of a PV module comprising PV cells made according embodiments of the method disclosed herein, according to one aspect of the invention.

As discussed in detail below at least in relation to FIGS. 1-2, and FIG. 8, embodiments of the invention disclosed herein provide methods for making improved PV cells. FIGS. 5-7 show representative data of operational parameters obtained on p-type PV cells fabricated according to the embodiments of the presently disclosed methods. Furthermore, as discussed in detail in relation to FIG. 9, embodiments of the invention disclosed herein provide methods for achieving p-type doping levels within CdTe, enhanced over currently demonstrated p-type doping levels within CdTe.

FIG. 1 is a flow-chart illustration of a method 100 of making a PV cell, according to one embodiment of the invention. The method 100 includes a step 102 of providing a first component including a CdTe layer including an interfacial region. This is to be followed by a step 104 of subjecting the first component to a functionalizing treatment to obtain a first green component, wherein the functionalizing treatment comprises treating at least a portion of the interfacial region with a first material comprising copper and a second material comprising chlorine. This is to be followed by a step 106 of subjecting the first green component to a first annealing treatment to obtain a second green component. This is to be followed by a step 108 of subjecting the second green component to a processing treatment (discussed below). This is to followed by a step 110 of disposing a second component adjacent the CdTe layer to form the PV cell. Fabrication protocols via which one may obtain first component embodiments compatible for use during method 100 would be known to one of skill in the art. A non-limiting fabrication protocol is discussed further below.

In one embodiment of the invention, the first component provided in step 102 includes a layer including at least one transparent conducting oxide. Non-limiting examples of suitable transparent conducting oxides include, aluminum doped zinc oxide, indium tin oxide, fluorine tin oxide, cadmium tin oxide, or combinations thereof. In one embodiment of the invention, the first component provided in step 102 includes a layer including at least one high resistance oxide. Non-limiting examples of suitable high resistance oxides include, zinc tin oxide, aluminum oxide, tin oxide, gallium oxide, silicon oxide, indium oxide, or combinations thereof. In one embodiment of the invention, the first component provided in step 102 includes a layer including cadmium sulphide.

In particular embodiments of the invention, the second material provided in step 104 includes cadmium chloride. Based on experiments, some representative results of which experiments are presented in FIGS. 4-7, in one embodiment of the invention, a ratio of an amount of the first material to an amount of the second material, which first material and second material are as recited in step 104, lies within the range from about 0.01 parts per million (ppm) to about 100 ppm. In another embodiment of the invention, a ratio of an amount of the first material to an amount of the second material, which first material and second material are as recited in step 104, lies within the range from about 0.1 ppm to about 20 ppm. In yet another embodiment of the invention, a ratio of an amount of the first material to an amount of the second material, which first material and second material are as recited in step 104, lies within the range from about 0.5 ppm to about 5 ppm.

In one embodiment of the invention, the first annealing treatment as recited in step 106 is performed at temperatures that lie within a range from about 300 degrees Celsius (° C.) to about 500° C. In another embodiment of the invention, the first annealing treatment recited in step 106 is performed at temperatures that lie within a range from about 350° C. to about 450° C. In yet another embodiment of the invention, the first annealing treatment recited in step 106 is performed at temperatures that lie within a range from about 375° C. to about 425° C. In one embodiment of the invention, the first annealing treatment recited in step 106 is performed for a time period that lies within a range from about 1 minute to about 60 minutes. In another embodiment of the invention, the first annealing treatment recited in step 106 is performed for a time period that lies within a range from about 5 minutes to about 40 minutes. In another embodiment of the invention, the first annealing treatment recited in step 106 is performed for a time period that lies within a range from about 10 minutes to about 20 minutes. In particular embodiments of the invention, the first annealing treatment recited in step 106 is performed so that an environment of the first green component during the first annealing treatment comprises an oxidizing environment. Non-limiting examples of oxidizing environments include air. It is likely that at a least a portion of the CdTe layer, as provided during step 102, is rendered substantially p-type after the performance of step 106.

In particular embodiments of the invention, the processing treatment performed during step 108 includes a soaking treatment. In more particular embodiments of the invention, the soaking treatment includes the use of a solvent including ethylene di-amine (EDA). In particular embodiments of the invention, the processing treatment performed during step 108 includes deposition of a copper layer on at least a portion of the interfacial region. In particular embodiments of the invention, the processing treatment performed during step 108 includes a second annealing treatment.

In particular embodiments of the invention, the second component provided in step 110 includes a back-contact layer. In more particular embodiments of the invention, the back-contact layer includes a plurality of layers. In such specific embodiments of the invention wherein the back-contact layer includes a plurality of layers, the back-contact may be assembled or disposed layer-by-layer, (that is, each layer of the plurality of layers is disposed sequentially), adjacent the CdTe layer. A non-limiting example of such layer-by-layer, or sequential assembly of the back-contact layer includes a procedure whereby each of the plurality of layers is disposed one after another adjacent the CdTe layer. Non-limiting examples of methods via which the second component may be assembled or disposed adjacent the CdTe layer include deposition methods including at least one of screen printing, sputtering, evaporating, electroplating, electrodepositing, or electroless plating.

As discussed, embodiments of the invention include a back-contact layer comprising a plurality of layers. In one non-limiting embodiment, the back-contact comprises three layers, wherein, the first of the three layers comprises graphite deposited via a method comprising at least one of screen printing; the second of the three layers comprises a metal deposited via a method comprising at least one of sputtering, evaporating, electroplating, or electroless plating; and the third of the three layers comprises an electrode layer comprising a metal comprising at least one of aluminum, nickel, palladium, titanium, molybdenum, chromium, or gold, and is deposited via a method comprising at least one of sputtering, evaporating, electroplating, or electroless plating. In another non-limiting embodiment, the back-contact comprises two layers, wherein, the first of the two layers comprises at least one of zinc tellurium (for example, ZnTe), antimony tellurium (for example, $Sb_2Te_3$), arsenic tellurium (for example, $As_2Te_3$), tellurium (Te), or copper tellurium (for example, $Cu_xTe$, wherein 'x' lies between one and two) deposited via a method comprising at least one of sputtering, evaporating, electrodeposition, or electroless plating; and the second of the two layers comprises a metal comprising at least one of aluminum, nickel, palladium, titanium, molybdenum, chromium, or gold, and is deposited via a method comprising at least one of sputtering, evaporating, electroplating, or electroless plating. In yet another non-limiting embodiment, the back-contact comprises a single layer, wherein the single layer comprises a metal comprising at least one of aluminum, nickel, palladium, titanium, molybdenum, chromium, or gold, and is deposited via a method comprising at least one of sputtering, evaporating, electroplating, or electroless plating.

Figure 2:
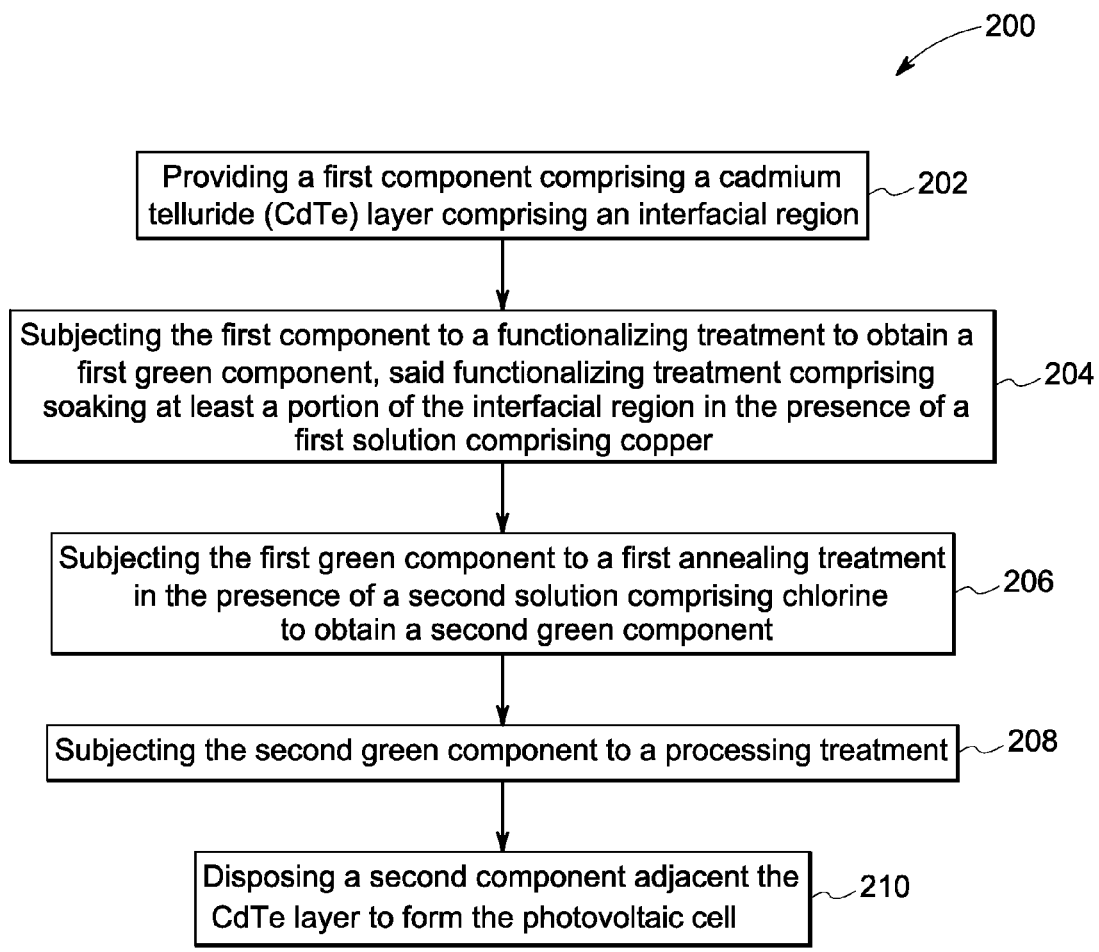
FIG. 2 is a flow-chart illustration of a method of making a PV cell, according to one embodiment of the invention.

FIG. 2 is a flow-chart illustration of a method 200 of making a PV cell, according to one embodiment of the invention. The method 200 includes a step 202 of providing a first component comprising a CdTe layer comprising an interfacial region. This is to be followed by a step 204 of subjecting the first component to a functionalizing treatment to obtain a first green component, the functionalizing treatment comprising soaking at least a portion of the interfacial region in the presence of a first solution comprising copper. This is to be followed by a step 206 of subjecting the first green component to a first annealing treatment in the presence of a second solution comprising chlorine to obtain a second green component. This is to be followed by a step 208 of subjecting the second green component to a processing treatment. This is to be followed by a step 210 of disposing a second component adjacent the CdTe layer to form the PV cell.

In one embodiment of the invention, the first component provided in step 202 includes a layer comprising at least one transparent conducting oxide. Non-limiting examples of suitable transparent conducting oxides include, aluminum doped zinc oxide, indium tin oxide, fluorine tin oxide, cadmium tin oxide, or combinations thereof. In one embodiment of the invention, the first component provided in step 202 comprises a layer including at least one high resistance oxide. Non-limiting examples of suitable high resistance oxides include, zinc tin oxide, aluminum oxide, tin oxide, gallium oxide, silicon oxide, indium oxide, or combinations thereof. In one embodiment of the invention, the first component provided in step 202 comprises a layer including cadmium sulphide.

In particular embodiments of the invention, the first solution recited in step 204 includes a solvent. A non-limiting example of a suitable solvent includes EDA. In more particular embodiments of the invention, a concentration of copper within the first solution, as recited in step 204, should lie within the range from about 0.01 ppm to about 100 ppm.

In particular embodiments of the invention, the first annealing treatment recited in step 206 is performed at temperatures that lie within a range from about 300° C. to about 500° C. In particular embodiments of the invention, the first annealing treatment recited in step 206 is performed for a time period that lies within a range from about 1 minute to about 60 minutes. In particular embodiments of the invention, the first annealing treatment recited in step 206 is performed so that an environment of the first green component during the first annealing treatment comprises an oxidizing environment. It is likely that the CdTe layer provided during step 202 is rendered substantially p-type after performance of step 206.

In particular embodiments of the invention, the processing treatment performed during step 208 includes a soaking treatment. In more particular embodiments of the invention, the soaking treatment includes the use of an solvent including EDA. In particular embodiments of the invention, the processing treatment performed during step 208 includes deposition of a copper layer on at least a portion of the interfacial region. In particular embodiments of the invention, the processing treatment performed during step 208 includes a second annealing treatment.

In particular embodiments of the invention, the second component provided in step 210 includes a back-contact layer. In more particular embodiments of the invention, the back-contact layer includes a plurality of layers. In such specific embodiments of the invention wherein the back-contact layer includes a plurality of layers, the back-contact may be assembled step-by-step, or sequentially, adjacent the CdTe layer. A non-limiting example of such step-by-step, or sequential, assembly of the back-contact layer includes a procedure whereby each of the plurality of layers is disposed one after another, adjacent the CdTe layer. Non-limiting examples of methods via which the second component may be disposed adjacent the CdTe layer include deposition methods including at least one of screen printing, sputtering, evaporating, electroplating, electrodepositing, or electroless plating.

Considering for instance method 100, and not to be limited to any particular explanation or theory, it is likely that the chlorine as recited in step 104 of method 100, acts as a fluxing agent, whereby the chlorine helps in reducing a temperature that is required for recrystallization and grain growth, of the CdTe provided as part of the first component during step 102, during the first annealing treatment as recited in step 106, which recrystallization and grain growth likely result in an enhancement of the electronic properties of the CdTe.

A representative non-limiting fabrication protocol via which one may obtain first component embodiments compatible for use during methods 100 or 200 is now discussed. A "batch" of first components is typically obtained or "cut" from the same sheet. A representative non-limiting fabrication protocol via which a sheet may be fabricated is now presented: a commercially available substrate comprising soda lime glass and having a layer comprising fluorine doped tin oxide deposited on its surface was provided. On the layer comprising fluorine doped tin oxide was deposited a layer comprising a high resistance oxide comprising zinc tin oxide approximately 1000 angstroms (Å) in thickness via reactive sputtering using direct current in an oxygen ambient having pressure between about 1 milli Ton (mT) to about 5 mT. The target used for the deposition of the layer comprising zinc tin oxide had a composition of approximately 5% zinc by weight and approximately 95% tin by weight. On the layer comprising zinc tin oxide was further deposited a layer comprising cadmium sulphide (CdS) approximately 1000 Å in thickness via radio frequency (RF) sputtering in an argon ambient having pressure between about 5 mT to about 15 mT. On the layer comprising CdS was deposited a layer comprising cadmium telluride (CdTe) approximately 3 micrometers in thickness via a modified close-spaced sublimation (CSS) method wherein the substrate temperature was maintained between about 400° C. to about 600° C. It is mentioned that the CSS method used herein differs from more standard CSS methods known within the art in at least one respect, whereby a distance between the location where the material (in the present instance, CdTe) is to be deposited and the source of the material is on the order of tens of centimeters, whereas in more standard CSS methods, this distance is on the order of millimeters. It is remarked that alternate protocols, for instance, protocols in which deposition of the layer comprising a high resistance oxide is omitted, may also be used to obtain sheets that are compatible for use within embodiments of the present invention. It is remarked that, first components fabricated via other known fabrication methods are also compatible for use within embodiments of the invention disclosed herein.

Again, considering for instance, the method 100: not to be limited to any particular explanation or theory, when the first component provided during step 102 comprises a layer comprising cadmium sulphide (CdS), then it is likely that the chlorine as recited in step 104 of method 100, helps in an intermixing of the CdTe (also provided during step 102) and the CdS, so that a layer comprising $CdS_xTe_{1-x}$ (where, 'x' lies between zero and one) is formed along the interface region between the CdTe and the CdS. Not to be limited to any particular explanation or theory, it is likely that the presence of the layer comprising $CdS_xTe_{1-x}$ enhances the minority carrier lifetime in the CdTe. Furthermore, it is also likely that the chlorine acts as a p-type dopant within the CdTe. It is also likely that the chlorine getters defects to the grain boundaries within the CdTe layer. Evidently, these discussions remain substantially applicable for other embodiments of the invention disclosed herein, in particular, these discussions are applicable for method 200.

Figure 3:
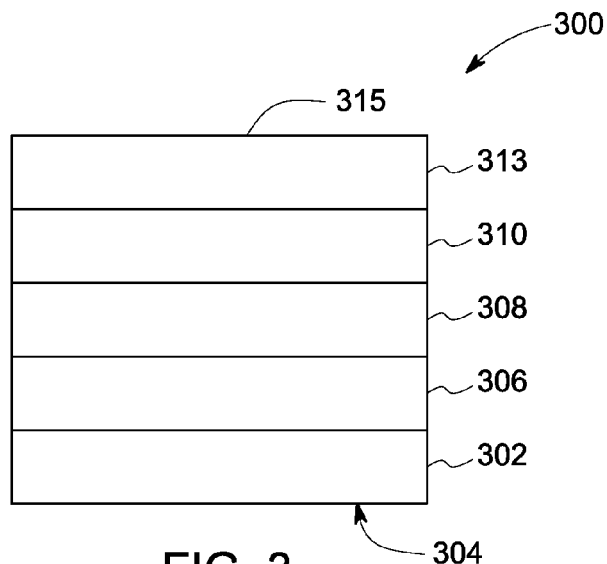
FIG. 3 is a side-cross section view of a first component, according to one aspect of the invention.

FIG. 3 is a side-cross section view of a first component 300 as recited within the methods 100, 200. The first component 300 includes a CdTe layer 302 comprising an interfacial region 304. As discussed herein, the first component may further include additional layers. For instance, the first component 300 includes four additional layers 306, 308, 310, 313, wherein the layer 306 comprises CdS, the layer 308 comprises at least one high resistance oxide, the layer 310 comprises at least one transparent conducting oxide, and layer 313 comprises a transparent substrate comprising glass. Surface 315 of the layer 313 may be configured to receive a light energy flux (not shown; see FIG. 4, reference numeral 417). These aspects of the invention will be discussed in more detail in context at least of FIG. 4.

Figure 4:
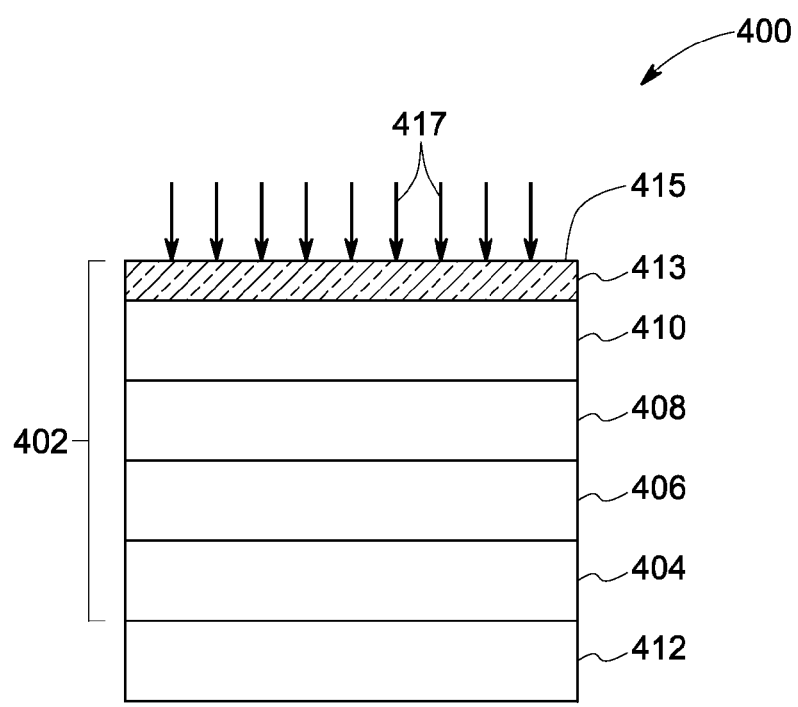
FIG. 4 is a side cross-section view of a PV cell, according to one aspect of the invention.

FIG. 4 is a side cross-section view of a PV cell 400 made according to embodiments of the methods recited herein, for instance, methods 100, 200. The PV cell 400 includes a first component 402 (similar to first component 300) including a CdTe layer 404. The first component 402 further includes additional layers 406, 408, and 410, wherein layer 406 comprises CdS, layer 408 comprises at least one high resistance oxide, and layer 410 comprising at least one transparent conducting oxide, and 413 comprises a transparent substrate, for example glass. The PV cell 400 further includes a second component 412. It is clarified that, even though the second component 412 shown in FIG. 4 includes only a single layer, second components including multiple layers fall within the purview of the present invention. For instance, the second component 412 may comprise a back-contact layer, wherein the back-contact layer comprises a plurality of layers. Based on the discussions herein, those of skill in the art may now appreciate that, before the second component 412 is disposed adjacent to the CdTe layer 404 (for instance, as per methods 100, 200) to realize the PV cell as shown in FIG. 4, the interfacial region (akin to interfacial region 308; see FIG. 3)

of the first component 402 is subjected to treatments as recited in, for instance, steps 104, 106, and 108, or as recited, for instance, in steps 204, 206, 208. Surface 415 of the layer 413 may be configured to receive a light energy flux 417, at least a portion of which light energy flux 417, when it continues on to the layer 404, results in the photo-generation of charge carriers (electrons and holes), that is, results in the photovoltaic action of the PV cell 400.

FIGS. 5-6 show that the operational characteristics, such as surface photo-voltage (SPV) (FIG. 5), or current-voltage characteristics (FIG. 6) of PV cells obtained via methods 100, 200, and equivalent and generalized methods thereof (discussed in relation to FIGS. 8-9), are enhanced over the operational characteristics of PV cells obtained via conventional fabrication methods known within the art. FIG. 6 compares the energy conversion efficiency of module incorporating PV cells obtained via methods 100, 200, to the energy conversion efficiency of modules incorporating PV cells obtained conventional methods known in the art.

FIG. 5 is a bar-chart 500 of SPV values plotted along the ordinate 510 for a series of "second" components, each of which series of first components were subjected to an illumination of about one Sun, or about 100 milli watts per square centimeter. Each of the first components was substantially similar since they were obtained or "cut" from the same sheet which sheet was obtained as per the discussions presented earlier.

Consider for instance, bars 502 and 504. Bar 502 represents SPV value data obtained on a first component that was subjected to a soaking treatment using EDA solution. No subsequent exposure to copper was provided. The resulting obtained component was then subjected to a treatment with cadmium chloride. The treatment with cadmium chloride was performed for about 20 minutes at a temperature of about 400° C. The SPV value represented by bar 502 was obtained on the thus obtained second component after the treatment with cadmium chloride. Consider now, the bar 504, which represents SPV value data obtained on a first component that was neither subjected to any soaking treatment, nor to any treatment with a solution containing chlorine, as was the case for the first component corresponding to bar 502. It is clear that the SPV values represented by both bars 502 and 504, respectively at about 689 milli volts, and about 690 milli volts, are substantially the same. In other words, it is reasonably established that the SPV values are substantially unaffected by any soaking treatment.

Consider now the bars 506 and 508. Bar 506 represents SPV value data obtained on a first green component that was obtained from a first component that was subjected to treatments as recited in steps 104 and 106 of method 100. For instance, as part of performance of step 104, the first component was subjected to a functionalizing treatment to obtain a first green component, the functionalizing treatment comprising treating at least a portion of the interfacial region with a first material comprising copper and a second material comprising cadmium chloride. As part of performance of step 106, the first green component was further subjected to a first annealing treatment in air for about 20 minutes at a temperature of about 400 degrees Celsius to obtain a second green component. Bar 508 represents SPV value data obtained on a first green component that was obtained from a first component that was subjected to treatments as recited in steps 204 of method 200. For instance, as part of performance of step 204, the first component was subjected to a functionalizing treatment to obtain a first green component, the functionalizing treatment comprising soaking at least a portion of the interfacial region in the presence of a first solution comprising EDA and copper. As part of performance of step 206, the first green component was further subjected to a first annealing treatment in air for about 20 minutes at a temperature of about 400° C. to obtain a second green component. The SPV values represented by both bars 506 and 508, respectively at about 775 milli volts, and at about 797 volts, are substantially higher than the baseline SPV values represented by bars 502 or 504, respectively.

It is evident from a comparison of bars 502, 504, with bar 506, or with bar 508, that the presence of the copper during the performance of the functionalizing treatment significantly enhances the SPV value obtainable from the resulting second green component. Those of skill in the art would appreciate that this enhancement in SPV value will likely result in an enhancement of the efficiency of a PV cell that includes such a second green component.

FIG. 6 shows data that compares the effect on operational characteristics (for instance, current-voltage "J-V" characteristics), due the use of different amounts of copper during performance of step 104. FIG. 6 show current voltage "J-V" data sets 602, 604, and 606 obtained on three PV cells that were made via embodiments of the method 100, wherein differing amounts of copper were was used during the performance of step 104.

The PV cells of FIG. 6 included first components that were obtained from a sheet that was substantially similarly prepared as the sheet from which the first components were obtained in the example of FIG. 5. Accordingly, three first components was subjected to treatments according to method 100 wherein, a concentration of copper within a first material (during performance of an embodiment of step 104) was about 0 parts per million (ppm) (FIG. 6, data represented via reference numeral 602), that is, no copper was added to the first solution, about 1.5 ppm (FIG. 6, data represented via reference numeral 604), and about 4.5 ppm (FIG. 6, data represented via reference numeral 606) respectively, to obtain respective first green components. Following the performance of step 104, in accordance with an embodiment of step 106, the obtained respective first green components were subjected to first annealing treatment at about 400° C. for about 20 minutes in the presence of a cadmium chloride solution to obtain respective second green components. Following said performance of an embodiment of step 106, in accordance with an embodiment of step 108, the respective second green components were subjected to a processing treatment wherein a copper layer is deposited on the interfacial region. The processing treatment further comprised a second annealing treatment, of the second green component with the copper layer deposited on the interfacial region, at a temperature of about 170° C. for about 12 minutes. Following said performance of an embodiment of step 108, in accordance with an embodiment of step 110, a back-contact layer comprising graphite was deposited adjacent the CdTe layer. The back-contact layer included electrodes comprising nickel and aluminum. Standard laser scribing processes were used to fashion said electrodes.

FIG. 6 shows J-V data-sets with the current "J" obtained being plotted along the ordinate 608 as a function of the voltage "V" along abscissa 610, for a given PV cell. For the particular data-sets shown in FIG. 6, the corresponding PV cells were illuminated over an aperture area of about 125 square centimeters, and with an illumination intensity of about one Sun. Beyond a voltage value of about 0.8 volts, it is evident from FIG. 6 that the amount of current obtainable for a given voltage for the PV cell corresponding to the data-set 604 is enhanced relative to the PV cell corresponding to the data-set 602. Similarly, beyond a voltage value of about 0.8 volts, it is evident that the amount of current obtainable for a given voltage for the PV cell corresponding to the data-set 606 is enhanced relative to the PV cell corresponding to the data-set 604. In other words, as evidenced by the trend in the J-V characteristics shown in FIG. 6, the operational characteristics of PV cells are a function of the amount of copper used during performance of step 104.

FIG. 7 is a bar-chart that compares the efficiency of a PV module comprising PV cells made according to an embodiment of the method 200, to the efficiency of a PV module comprising PV cells similarly made, without undergoing the functionalizing treatment of method 200. Each of the PV modules corresponding to the bars 702 and 704 had a total area of about 7200 square centimeters. It is evident that the performance of the functionalizing treatment to the PV cells results in an enhancement of the efficiency from a value of about 4.8% to about 8%. Since there is a well-known direct positive correlation between the current obtainable for a given voltage from a particular PV cell, and the efficiency of the same PV cell, a gestalt assessment of the data presented in FIGS. 6-7, would make evident to one of skill in the art, that the functionalizing treatment in the presence of copper during the fabrication of PV cells according the embodiments of the presently invented method, for instance, method 200, results in PV cells with enhanced efficiency.

Based at least on the methods presented in FIGS. 1-2, and the experimental results presented in FIGS. 5-7, it may now be evident that the presence of a p-type dopant (such as copper) during an annealing treatment (for instance, the first annealing treatment as recited in step 106, or in step 206) substantially results in enhanced p-type doping levels within a CdTe layer (for instance, the CdTe layer recited in step 102, or in step 202), which enhancement in turn enables the realization of p-type CdTe PV cells having efficiencies enhanced over the efficiencies of currently available p-type CdTe PV cells. Non-limiting examples of p-type dopants suitable for use within embodiments of the present invention include copper phosphorus, arsenic, antimony, gold, silver, and bismuth. Non-limiting examples of halogens suitable for use within embodiments of the present invention include chlorine.

Figure 8:
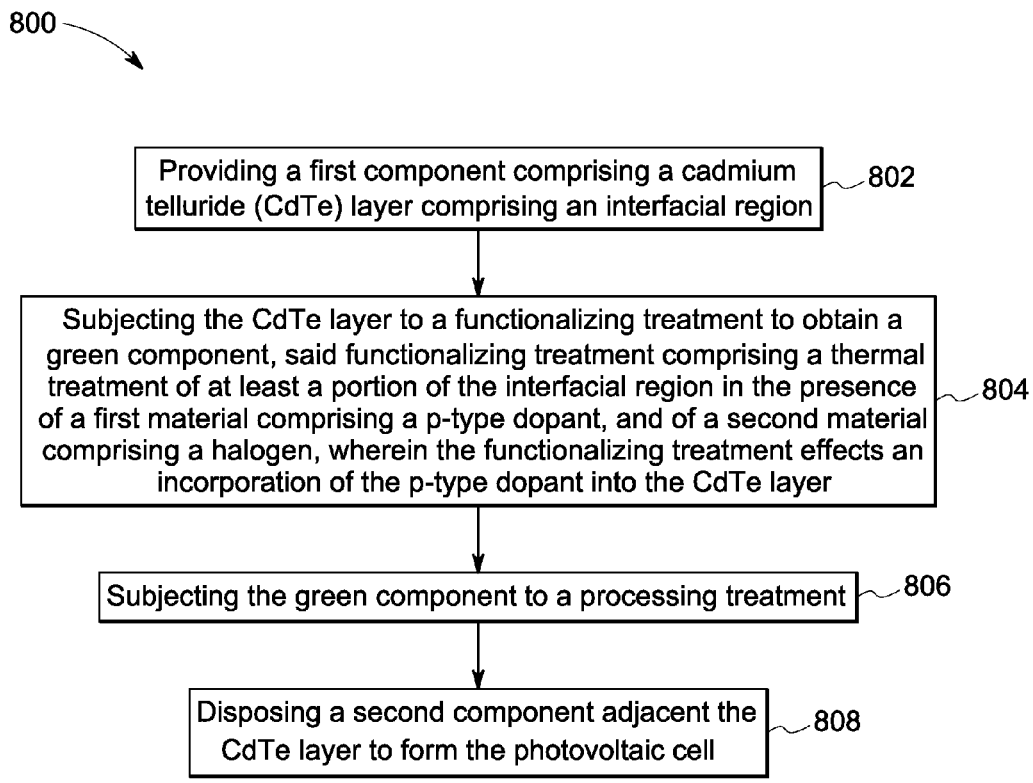
FIG. 8 is a flow-chart illustration of a method of making a PV cell, according to one embodiment of the invention.

FIG. 8 is a flow-chart illustration of another method 800 of making a PV cell, according to one embodiment of the invention. The method 800 includes a step 802 of providing a first component comprising a CdTe layer comprising an interfacial region. This is to be followed by a step 804 of subjecting the CdTe layer to a functionalizing treatment to obtain a green component, the functionalizing treatment comprising a thermal treatment of at least a portion of the interfacial region in the presence of a first material comprising a p-type dopant, and of a second material comprising a halogen, wherein the functionalizing treatment effects an incorporation of the p-type dopant into at least a portion of the CdTe layer. In other words, it is likely that the CdTe layer provided during step 802 is rendered substantially p-type after performance of step 804. This is to be followed by step 806 of subjecting the green component to a processing treatment. This is to be followed by step 808 of disposing a second component adjacent the CdTe layer to form the PV cell.

In one embodiment of the invention, the first component provided in step 802 includes a layer including at least one transparent conducting oxide. Non-limiting examples of suitable transparent conducting oxides include, aluminum doped zinc oxide, indium tin oxide, fluorine tin oxide, cadmium tin oxide, or combinations thereof. In one embodiment of the invention, the first component provided in step 802 includes a layer including at least one high resistance oxide. Non-limiting examples of suitable high resistance oxides include, zinc tin oxide, aluminum oxide, tin oxide, gallium oxide, silicon oxide, indium oxide, or combinations thereof. In one embodiment of the invention, the first component provided in step 802 includes a layer including cadmium sulphide. It is mentioned that the methods via which one may obtain first component embodiments compatible for use during method 100 or method 200 (discussed earlier) are also substantially applicable to obtain first component embodiments compatible for use with method 800, or with method 900 (discussed below).

In particular embodiments of the invention, the second material provided in step 804 includes cadmium chloride, hydrochloric acid, chlorine gas, or combinations thereof. Based on experiments, representative results of which experiments are presented in FIGS. 5-7, in more particular embodiments of the invention, a ratio of an amount of the first material to an amount of the second material, as recited during step 804, lies within the range from about 0.01 ppm to about 100 ppm.

In particular embodiments of the invention the thermal treatment recited in step 804 includes a first annealing treatment. In particular embodiments of the invention, said first annealing treatment is performed at temperatures that lie within a range from about 1 minute to about 60 minutes. In particular embodiments of the invention, said first annealing treatment recited is performed so that an environment of the green component during the first annealing treatment comprises an oxidizing environment.

In particular embodiments of the invention, the processing treatment performed during step 806 includes a soaking treatment. In more particular embodiments of the invention, the soaking treatment includes the use of a solvent including at least one of EDA, a dilute solution of bromine in methanol, or a mixture of nitric acid and phosphoric acid. In particular embodiments of the invention, the processing treatment performed during step 806 includes deposition of a copper layer on at least a portion of the interfacial region (for instance, interfacial region 308). In particular embodiments of the invention, the processing treatment performed during step 806 includes a second annealing treatment.

In particular embodiments of the invention, the second component provided in step 808 includes a back-contact layer. In more particular embodiments of the invention, the back-contact layer includes a plurality of layers. In such specific embodiments of the invention wherein the back-contact layer includes a plurality of layers, the back-contact may be assembled layer-by-layer, that is, sequentially, adjacent the CdTe layer. A non-limiting example of such layer-by-layer or sequential assembly of the back-contact layer includes a procedure whereby each of the plurality of layers is disposed one after another adjacent the CdTe layer. Non-limiting examples of methods via which the second component, or components layers thereof, may be disposed adjacent the CdTe layer include deposition methods including at least one of screen printing, sputtering, evaporating, electroplating, electrodepositing, or electroless plating.

Based at least on the methods presented in FIGS. 1-2, and 8, and the experimental results presented in FIGS. 5-7, it may now be evident of one of skill in the art that, quite generally, the presence of a p-type dopant during an annealing treatment (for instance, the first annealing treatment as recited in step 106, or in step 206) can be utilized to obtain enhanced p-type doping levels within a CdTe layer (for instance, the CdTe layer recited in step 102, or in step 202).

Figure 9:
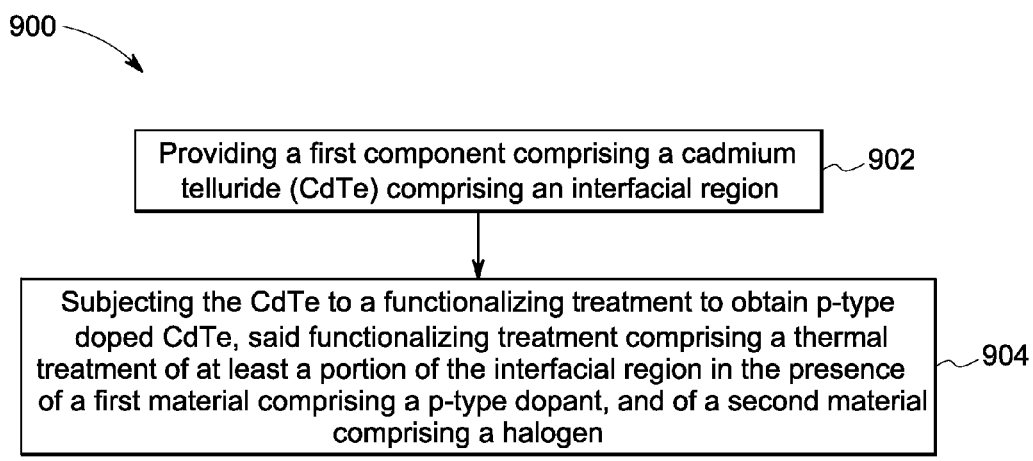
FIG. 9 is a flow-chart illustration of a method of p-type doping CdTe, according to one embodiment of the invention.

FIG. 9 is a flow-chart illustration of a method 900 of p-type doping CdTe, according to one embodiment of the invention. The method 900 includes a step 902 of providing a first component including CdTe including an interfacial region. This is to be followed by a step 904 of subjecting the CdTe to a functionalizing treatment to obtain p-type doped CdTe, the functionalizing treatment comprising a thermal treatment of at least a portion of the interfacial region in the presence of a first material comprising a p-type dopant, and of a second material comprising a halogen. In particular embodiments of the invention, the functionalizing treatment recited in step 904 includes depositing the first material on at least a portion of the interfacial region prior to the thermal treatment.

In particular embodiments of the invention a physical form of the CdTe as recited in step 902 is polycrystalline. In particular embodiments of the invention, the first material recited in step 904 comprises a liquid, or a gas. In more particular embodiments of the invention, the second material recited in step 904 comprises a liquid, or a gas.

Non-limiting examples of the p-type dopant recited in step 904 include bismuth, phosphorous, arsenic, antimony, gold, or copper. Non-limiting examples of the second material recited in step 904 include cadmium chloride, hydrochloric acid, chlorine gas, or combinations thereof. In particular embodiments of the invention, the first material recited in step 904 further comprises at least one of EDA, a dilute solution of bromine in methanol, or a mixture of nitric acid and phosphoric acid.

Based on experiments, representative results of which are presented in FIGS. 5-7, in more particular embodiments of the invention, a ratio of an amount of the first material to an amount of the second material, as recited in method 900, should lie within the range from about 0.01 ppm to about 100 ppm.

In particular embodiments of the invention the thermal treatment recited in step 904 includes a first annealing treatment. In particular embodiments of the invention, said first annealing treatment is performed at temperatures that lie within a range from about 300° C. to about 500° C. In particular embodiments of the invention, said first annealing treatment is performed for a time period that lies within a range from about 1 minute to about 60 minutes. In particular embodiments of the invention, said first annealing treatment recited is performed so that an environment of the green component during the first annealing treatment comprises an oxidizing environment.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method of making a photovoltaic (PV) cell, said method comprising the steps of:
    (a) providing a first component comprising a cadmium telluride (CdTe) layer comprising an interfacial region;
    (b) subjecting the first component to a functionalizing treatment to obtain a first green component, said functionalizing treatment comprising treating at least a portion of the interfacial region with a first material comprising copper and a second material comprising chlorine;
    (c) subjecting the first green component to a first annealing treatment to obtain a second green component;
    (d) subjecting the second green component to a processing treatment; and
    (e) disposing a second component adjacent the CdTe layer to form the PV cell.

2. The method of claim 1, wherein the processing treatment comprises a soaking treatment.

3. The method of claim 2, the soaking treatment comprises the use of a solvent comprising ethylene di-amine (EDA).

4. The method of claim 1, wherein the processing treatment comprises deposition of a copper layer on at least a portion of the interfacial region.

5. The method of claim 1, wherein the processing treatment comprises a second annealing treatment.

6. The method of claim 1, wherein the first component comprises a layer comprising a transparent conducting oxide.

7. The method of claim 6, wherein the transparent conducting oxide comprises aluminum doped zinc oxide, indium tin oxide, fluorine tin oxide, cadmium tin oxide, or combinations thereof.

8. The method of claim 1, wherein the first component comprises a layer comprising a high resistance oxide.

9. The method of claim 8, wherein the high resistance oxide comprises zinc tin oxide, aluminum oxide, tin oxide, gallium oxide, silicon oxide, indium oxide, or combinations thereof.

10. The method of claim 1, wherein the first component comprises a layer comprising cadmium sulphide.

11. The method of claim 1, wherein the second component comprises a back-contact layer.

12. The method of claim 11, wherein the back-contact layer comprises a plurality of layers.

13. The method of claim 12, wherein each of the plurality of layers is disposed sequentially adjacent the CdTe layer.

14. The method of claim 1, wherein disposing the second component is performed via a deposition method comprising at least one of screen printing, sputtering, evaporating, electroplating, electrodepositing, or combinations thereof.

15. The method of claim 1, wherein the second material comprises cadmium chloride.

16. The method of claim 1, wherein a ratio of an amount of the first material to an amount of the second material lies within the range from about 0.01 ppm to about 100 ppm.

17. The method of claim 1, wherein the first annealing treatment is performed at temperatures that lie within a range from about 300° C. to about 500° C.

18. The method of claim 1, wherein the first annealing treatment is performed for a time-period that lies within a range from about 1 minute to about 60 minutes.

19. The method of claim 1, wherein an environment of the first green component during the first annealing treatment comprises an oxidizing environment.

20. The method of claim 1, wherein the CdTe layer is rendered substantially p-type after step (c).

21. A method for making a photovoltaic cell, said method comprising the steps of:
    (a) providing a first component comprising a cadmium telluride (CdTe) layer comprising an interfacial region;
    (b) subjecting the first component to a functionalizing treatment to obtain a first green component, said functionalizing treatment comprising soaking at least a portion of the interfacial region in the presence of a first solution comprising copper;

(c) subjecting the first green component to a first annealing treatment in the presence of a second solution comprising chlorine to obtain a second green component;

(d) subjecting the second green component to a processing treatment; and (e) disposing a second component adjacent the CdTe layer to form the photovoltaic cell.

22. The method of claim 21, wherein the processing treatment comprises a soaking treatment.

23. The method of claim 22, the soaking treatment comprises the use of a solvent comprising EDA.

24. The method of claim 21, wherein the processing treatment comprises deposition of a copper layer on at least a portion of the interfacial region.

25. The method of claim 21, wherein the processing treatment comprises a second annealing treatment.

26. The method of claim 21, wherein the first solution comprises an a solvent.

27. The method of claim 26, wherein the solvent comprises EDA.

28. The method of claim 21, wherein the first component comprises a layer comprising a transparent conducting oxide.

29. The method of claim 28, wherein the transparent conducting oxide comprises aluminum doped zinc oxide, indium tin oxide, fluorine tin oxide, cadmium tin oxide, or combinations thereof.

30. The method of claim 29, wherein the first component comprises a layer comprising a high resistance oxide.

31. The method of claim 30, wherein the high resistance oxide comprises zinc tin oxide, aluminum oxide, tin oxide, gallium oxide, silicon oxide, indium oxide, or combinations thereof.

32. The method of claim 21, wherein the first component comprises a layer comprising cadmium sulphide.

33. The method of claim 21, wherein the second component comprises a back-contact layer.

34. The method of claim 33, wherein the back-contact layer comprises a plurality of layers.

35. The method of claim 34, wherein each of the plurality of layers is disposed sequentially adjacent the CdTe layer.

36. The method of claim 21, wherein disposing the second component is performed via a deposition method comprising at least one of screen printing, sputtering, evaporating, electroplating, electrodepositing, or combinations thereof.

37. The method of claim 21, wherein the second solution comprises cadmium chloride.

38. The method of claim 21, wherein a concentration of the copper within the first solution lies within the range from about 0.01 ppm to about 100 ppm.

39. The method of claim 21, wherein the first annealing treatment is performed at temperatures that lie within a range from about 300° C. to about 500° C.

40. The method of claim 21, wherein the first annealing treatment is performed for a time-period that lies within a range from about 1 minute to about 60 minutes.

41. The method of claim 21, wherein an environment of the first green component during the first annealing comprises an oxidizing environment.

42. The method of claim 21, wherein the CdTe layer is rendered substantially p-type after step (c).

* * * * *

UNITED STATES PATENT AND TRADEMARK OFFICE
CERTIFICATE OF CORRECTION

| | |
|---|---|
| PATENT NO. | : 8,039,290 B2 |
| APPLICATION NO. | : 12/639099 |
| DATED | : October 18, 2011 |
| INVENTOR(S) | : Feldman-Peabody et al. |

It is certified that error appears in the above-identified patent and that said Letters Patent is hereby corrected as shown below:

In Column 7, Line 55, delete "Ton" and insert -- Torr --, therefor.

In Column 15, Line 17, in Claim 26, delete "an a" and insert -- a --, therefor.

Signed and Sealed this
Twelfth Day of June, 2012

David J. Kappos
*Director of the United States Patent and Trademark Office*